(12) United States Patent
Tsukano (10) Patent No.: US 11,765,448 B2
(45) Date of Patent: Sep. 19, 2023

(54) ELECTRONIC COMPONENT INCLUDING ELECTRONIC SUBSTRATE AND CIRCUIT MEMBER, APPARATUS, AND CAMERA

(71) Applicant: CANON KABUSHIKI KAISHA, Tokyo (JP)

(72) Inventor: Jun Tsukano, Hino (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/048,541

(22) Filed: Oct. 21, 2022

(65) Prior Publication Data
US 2023/0053757 A1 Feb. 23, 2023

Related U.S. Application Data

(62) Division of application No. 16/809,987, filed on Mar. 5, 2020, now Pat. No. 11,528,392.

(30) Foreign Application Priority Data

Mar. 15, 2019 (JP) .................. 2019-048543

(51) Int. Cl.
*H04N 23/52* (2023.01)
*H10K 50/11* (2023.01)
(Continued)

(52) U.S. Cl.
CPC ......... *H04N 23/52* (2023.01); *H01L 31/0203* (2013.01); *H01L 31/03926* (2013.01);
(Continued)

(58) Field of Classification Search
None
See application file for complete search history.

(56) References Cited

U.S. PATENT DOCUMENTS 9,766,763 B2 9/2017 Jinbo et al.
10,181,446 B2 1/2019 Dobashi
(Continued)

FOREIGN PATENT DOCUMENTS

JP 8-148666 A 6/1996
JP 2004-015604 A 1/2004
(Continued)

OTHER PUBLICATIONS

Notice of Reasons for Refusal in Japanese Application No. 2019-048543 (dated Feb. 2023).

*Primary Examiner* — Michelle Mandala
(74) *Attorney, Agent, or Firm* — VENABLE LLP (57) ABSTRACT

An electronic component comprising: an electronic substrate that includes an electronic element and a first connection terminal a package member that is disposed on the electronic substrate; and a circuit member that includes a second connection terminal, wherein the circuit member is disposed between the package member and the electronic substrate, and extends from the position between the package member and the electronic substrate outward beyond the edge of the electronic substrate; the electronic component includes a connecting member that is disposed between the circuit member and the electronic substrate, and electrically connects the second connection terminal and the first connection terminal, an adhesive member that is disposed between the circuit member and the package member, and joins the circuit member to the package member; the connecting member, the circuit member, and the adhesive member are located between the package member and the electronic substrate.

15 Claims, 7 Drawing Sheets

(51) Int. Cl.
*H01L 31/0392* (2006.01)
*H01L 31/0203* (2014.01)
*H10K 50/84* (2023.01)
*H10K 77/10* (2023.01)

(52) U.S. Cl.
CPC .............. *H10K 50/11* (2023.02); *H10K 50/84* (2023.02); *H10K 77/111* (2023.02)

(56) References Cited

U.S. PATENT DOCUMENTS

| | | |
|---|---|---|
| 10,228,807 B2 | 3/2019 | Jinbo et al. |
| 11,211,300 B2 | 12/2021 | Itotani et al. |
| 2004/0223072 A1 | 11/2004 | Maeda et al. |
| 2005/0088564 A1 | 4/2005 | Kim et al. |
| 2007/0278394 A1 | 12/2007 | Shangguan et al. |
| 2009/0016735 A1 | 1/2009 | Schmitz et al. |
| 2013/0286566 A1* | 10/2013 | Tsuduki ............... H05K 5/0091 361/679.01 |
| 2014/0353789 A1 | 12/2014 | Oganesian et al. |
| 2015/0116946 A1 | 4/2015 | Katase et al. |
| 2015/0130975 A1 | 5/2015 | Ueno et al. |
| 2016/0043240 A1 | 2/2016 | Oganesian et al. |
| 2019/0067350 A1 | 2/2019 | Fukuda |

FOREIGN PATENT DOCUMENTS

| | | |
|---|---|---|
| JP | 2005-109092 A | 4/2005 |
| JP | 2005-130497 A | 5/2005 |
| JP | 2007-194272 A | 8/2007 |
| JP | 2014-053512 A | 3/2014 |
| JP | 2014-150333 A | 8/2014 |
| JP | 2016-110067 A | 6/2016 |
| JP | 2016-111676 A | 6/2016 |
| JP | 2016-127018 A | 7/2016 |
| JP | 2016-524329 A | 8/2016 |
| JP | 2017-152521 A | 8/2017 |
| JP | 2018-125393 A | 8/2018 |
| WO | 2014/197370 A2 | 12/2014 |

\* cited by examiner

ELECTRONIC COMPONENT INCLUDING ELECTRONIC SUBSTRATE AND CIRCUIT MEMBER, APPARATUS, AND CAMERA

CROSS-REFERENCE TO RELATED APPLICATIONS

This application is a divisional application of U.S. patent application Ser. No. 16/809,987, filed Mar. 5, 2020, which claims the benefit of Japanese Patent Application No. 2019-048543, filed Mar. 15, 2019. Both prior applications are hereby incorporated by reference herein in their entirety.

BACKGROUND OF THE INVENTION

Field of the Invention

The present invention relates to an electronic component including an electronic substrate and a circuit member, an apparatus and a camera.

Description of the Related Art

An electronic component installed in an imaging apparatus, a display apparatus and the like normally includes: an electronic substrate on which an electronic element is disposed; a circuit member that supplies power to the electronic substrate from an external power supply; and a package member that protects the electronic substrate and the circuit member from moisture and dust.

The electronic substrate includes an element region where the electronic element is formed, and a peripheral region which is created on the outer edge side of the element region. In the peripheral region, an external connection terminal is disposed so as to bond the circuit member, such as a flexible printed circuit (FPC). The package member is disposed so as to enclose at least an element formed surface of the electronic substrate.

In order to decrease the size of an electronic substrate, minimizing the width of the peripheral region on the electronic substrate is demanded. To minimize the width of the peripheral region, the area of the external connection terminal may be decreased, but decreasing the bonding area between the external connection terminal and the circuit member decreases the bonding strength (reliability of the bonding).

Figure 6:
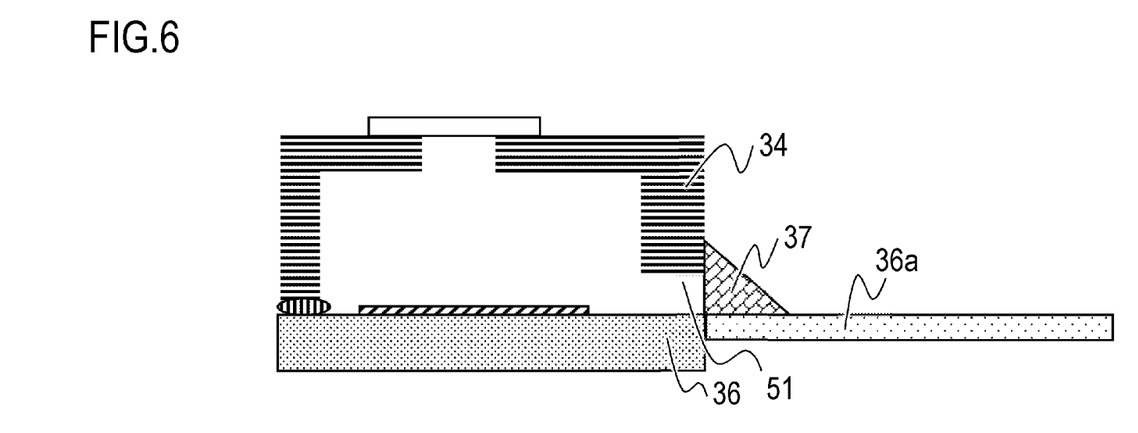
FIG. 6 is a diagram illustrating an electronic component according to a prior art.

In Japanese Patent Application Publication No. 2016-111676, on the other hand, the side face of a package member 34 (frame) and a circuit member 36a (FPC leading portion) are joined by an adhesive member 37 (reinforcing resin), as illustrated in FIG. 6. Thereby an improvement in the reliability of the bonding between the electronic substrate 36 and the circuit member 36a (rigid flexible member) is attempted.

SUMMARY OF THE INVENTION

In the case of Japanese Patent Application Publication No. 2016-111676, however, if a force that pulls the electronic substrate 36 is applied in a direction vertical to the principal surface of the circuit member 36a, a shearing stress is applied to an adhesive member 37 on the side face of the package member 34. As a result, the adhesive member 37 is peeled off along the side face of the package member 34.

Furthermore, a gap 51 (air hole) is formed between the bonding portion of the electronic substrate 36 and the circuit member 36a and the package member 34 without disposing the adhesive member 37. Therefore, if the circuit member 36a is pulled in the vertical direction, the adhesive member 37 is deformed, and a force to lift the bonding portion in the vertical direction is activated, whereby the circuit member 36a is easily peeled off.

With the foregoing in view, it is an object of the present technique to provide an electronic component which allows downsizing the electronic substrate while maintaining the reliability of the bonding between the electronic substrate and the circuit member.

A first aspect of the technology of the present disclosure is:

an electronic component comprising:

an electronic substrate that includes an electronic element and a first connection terminal;

a package member that is disposed on the electronic substrate;

a circuit member that includes a second connection terminal, wherein the circuit member is disposed between the package member and the electronic substrate, and the circuit member extends from the position between the package member and the electronic substrate outward beyond the edge of the electronic substrate;

a connecting member that is disposed between the circuit member and the electronic substrate, and electrically connects the second connection terminal and the first connection terminal;

an adhesive member that is disposed between the circuit member and the package member, and joins the circuit member to the package member; and a light-transmitting member that faces the electronic substrate via a space, wherein the connecting member, the circuit member, and the adhesive member are located between the package member and the electronic substrate, the package member encloses the space, the package member has a side face which faces the space, and the adhesive member covers the side face of the package member.

A second aspect of the technology of the present disclosure is:

an electronic component comprising:

an electronic substrate that includes an electronic element and a first connection terminal;

a package member that is disposed on the electronic substrate;

a circuit member that includes a second connection terminal, wherein the circuit member is disposed between the package member and the electronic substrate, and extends from the position between the package member and the electronic substrate outward beyond the edge of the electronic substrate;

a connecting member that is disposed between the circuit member and the electronic substrate, and electrically connects the second connection terminal and the first connection terminal;

an adhesive member that is disposed between the circuit member and the package member, and joins the circuit member to the package member; and an opposing substrate that faces the electronic substrate, wherein the connecting member, the circuit member and the adhesive member are located between the package member and the electronic substrate;

the opposing substrate and the electronic substrate are bonded together by a bonding member; and the opposing substrate and the circuit member are joined together by the adhesive member.

Further features of the present invention will become apparent from the following description of exemplary embodiments with reference to the attached drawings.

DESCRIPTION OF THE EMBODIMENTS

Preferred embodiment of the present technique will be described with reference to the accompany drawings. In each drawing, same members or same composing elements are denoted with a same reference number, and in the following embodiments, redundant description will be omitted.

Embodiment 1

Figure 1A:
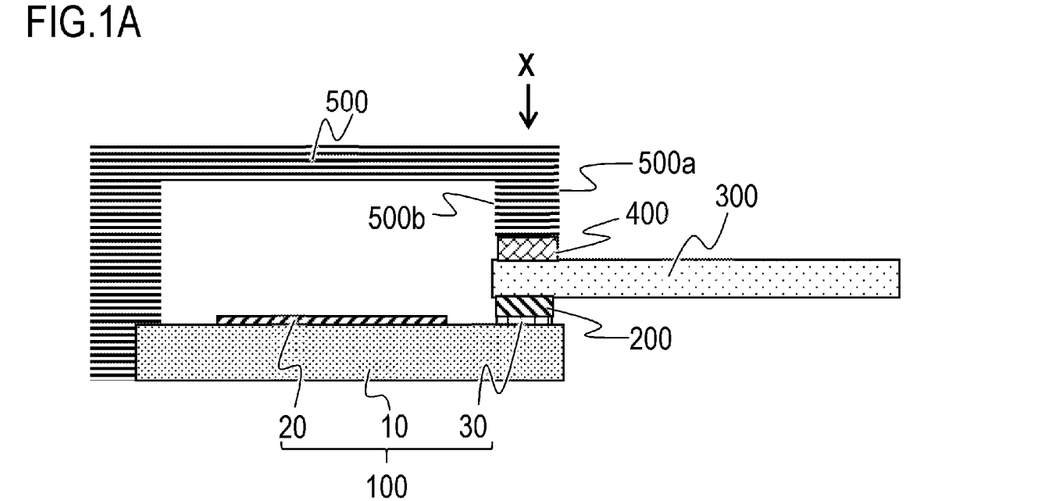
FIGS. 1A and 1B are diagrams illustrating an electronic component according to Embodiment 1.
Figure 1B:
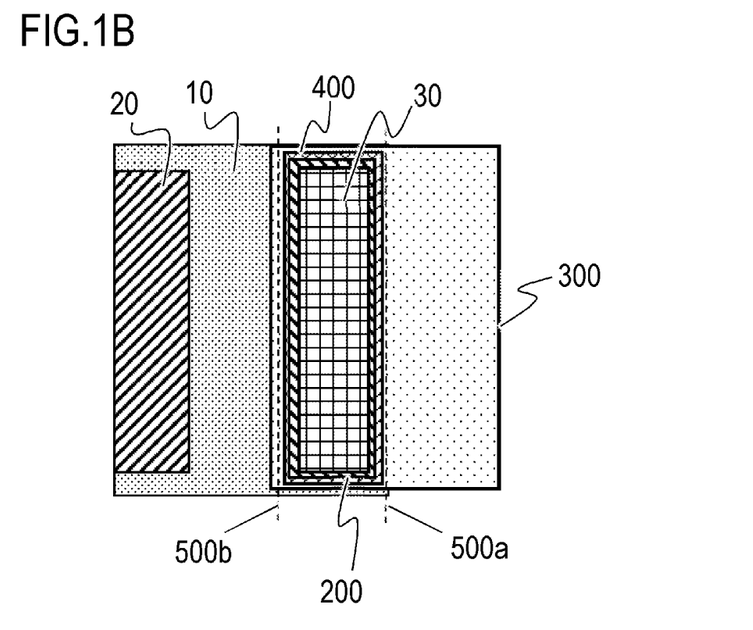

An electronic component according to Embodiment 1 of the present technique will be described with reference to FIGS. 1A and 1B. FIGS. 1A and 1B are schematic cross-sectional views to explain the electronic component of Embodiment 1.

General Configuration of Electronic Component

A general configuration of the electronic component of Embodiment 1 will be described first with reference to FIGS. 1A and 1B. FIG. 1A is a cross-sectional view of the electronic component, and FIG. 1B is a perspective view when the electronic component is viewed in the arrow X direction (from the top) in FIG. 1A. The electronic component of Embodiment 1 includes an electronic substrate 100, a connecting member 200, a circuit member 300, an adhesive member 400 and a package member 500.

The electronic substrate 100 includes a substrate 10 (e.g. silicon, glass), an electronic element 20, and an external connection terminal 30. On the first principal surface of the electronic substrate 100, an element region, in which the electronic element 20 is disposed, and a peripheral region, which is outside the element region and in which the external connection terminal 30 is disposed, exist. In the element region, a plurality of electronic elements 20 may be arrayed two-dimensionally. Thereby the electronic substrate 100 constitutes an electronic device. If the electronic element 20 is a display element (e.g. light-emitting element, liquid crystal element), the electronic device is the display device, and if the electronic element 20 is an image pickup device (e.g. photoelectric conversion element), the electronic device is the image pickup element. The external connection terminal 30 of the electronic substrate 100 and the circuit member 300 are bonded together via the connecting member 200, and are electrically connected with each other. Specifically, the external connection terminal 30 of the electronic substrate 100 and the connection terminal of the circuit member 300 are connected (bonded) together.

The connecting member 200 is disposed between the circuit member 300 and the electronic substrate 100. The connecting member 200 is a bump, an anisotropic conductive film, an anisotropic conductive paste or the like. In the case of using the bump for the connecting member 200, the external connection terminal 30 and the circuit member 300 are electrically connected by an ultrasonic wave or press heating. In the case of using an anisotropic conductive film or anisotropic conductive paste, on the other hand, the external connection terminal 30 and the circuit member 300 are electrically connected by heating and pressing.

The circuit member 300 is typically a printed circuit member, and is a rigid member (e.g. glass epoxy member, composite member) on which a wiring pattern is printed. The circuit member 300 may be a flexible circuit member (flexible printed circuit, which is a flexible film (e.g. polyimide) on which a wiring pattern is formed. Further, the circuit member 300 may be a rigid flexible circuit member, which is a composite of a flexible film and a rigid member. An electrode (connection terminal) to electrically connect with the external connection terminal 30 is formed on the surface of the circuit member 300 that is in contact with the connecting member 200, and an insulating member is formed on the surface of the circuit member 300 that is in contact with the adhesive member 400.

The circuit member 300 can supply power to the electronic substrate 100 from the outside (external electrode) of the electronic substrate 100. The circuit member 300 can also input signals to the electronic substrate 100 or output signals from the electronic substrate 100 to the outside. In other words, the circuit member 300 connects the electronic substrate 100 with the outside. The circuit member 300 is joined to the package member 500 by the adhesive member 400. Specifically, the portion of the second principal surface on the opposite side of the first principal surface is joined to the package member 500 by the adhesive member 400. On the portion of the first principal surface of the circuit member 300 is disposed the connecting member 200. The circuit member 300 extends from the position between the package member 500 and the electronic substrate 100 outward beyond the edge of the electronic substrate 100.

The adhesive member 400 is disposed between the circuit member 300 and the package member 500. The adhesive member 400 is made of such an adhesive material as a thermosetting resin, a two-liquid curing resin or a UV curing resin.

The package member 500 is disposed so as to enclose (cover) the electronic substrate 100 on the outer periphery of the electronic substrate 100. The package member 500 is disposed to prevent the entry of moisture and dust to the element formed surface of the electronic substrate 100. Therefore, the package member 500 is disposed so as to contact the first principal surface of the electronic substrate 100. The package member 500 is made of polyphenylene ether (PPE), liquid crystal polymer, polyamide or the like. In other words, the package member 500 is made of a material having rigidity (rigid member).

As illustrated in FIG. 1B, when the electronic component is viewed in the X direction, the connecting member 200 and the adhesive member 400 are disposed between the side face 500a on the outer side of the package member 500 and the side face 500b on the inner side of the package member 500. The electronic component of Embodiment 1 has a structure where the electronic substrate 100, the connecting member 200, the circuit member 300, the adhesive member 400 and the package member 500 are sequentially stacked without any gaps, in a portion where the connecting member 200 is disposed. In Embodiment 1, the stacking direction is a direction vertical to the first principal surface of the circuit member 300. In other words, the connecting member 200, the circuit member 300 and the adhesive member 400 are located between the package member 500 and the electronic substrate 100.

Manufacturing Method of Electronic Component

Figure 2A:
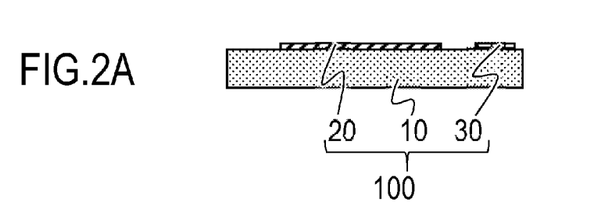
FIGS. 2A to 2D are diagrams illustrating manufacturing steps of the electronic component according to Embodiment 1.
Figure 2B:
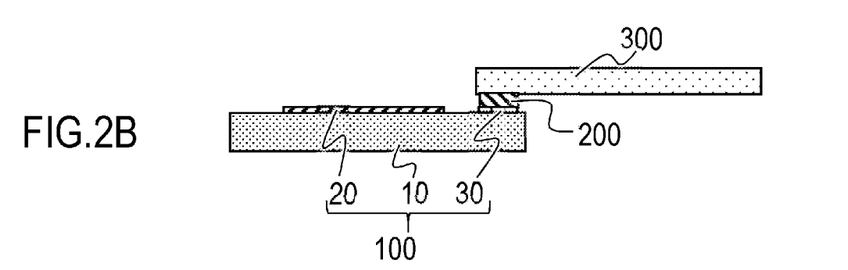
Figure 2C:
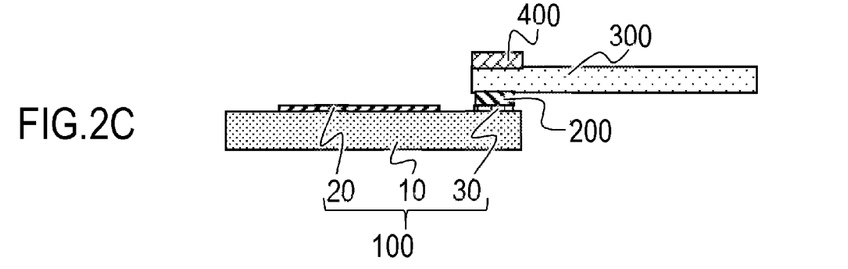
Figure 2D:
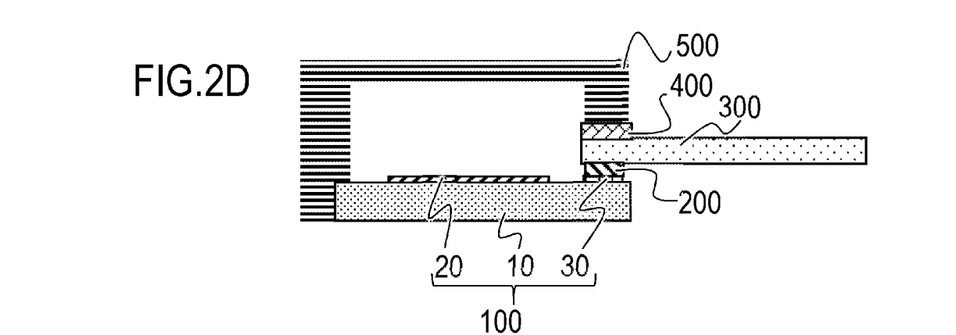
Figure 3:
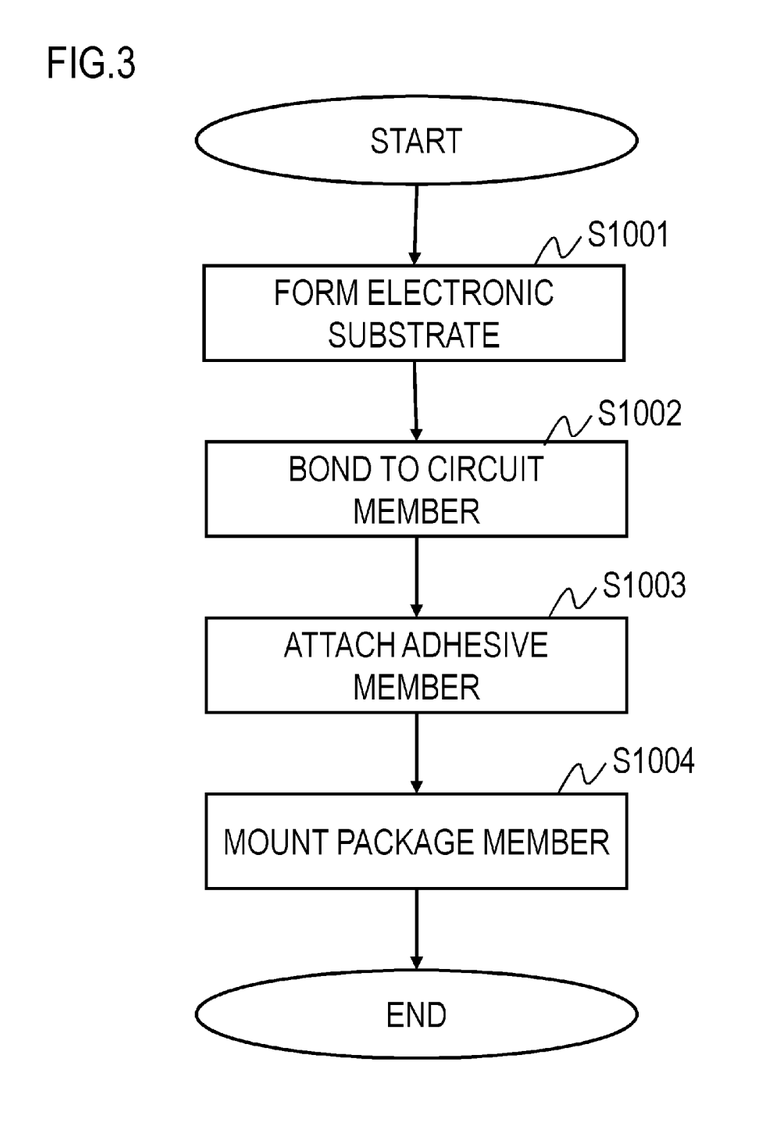
FIG. 3 is a flow chart illustrating a manufacturing method of the electronic component according to Embodiment 1.

A manufacturing method of the electronic component according to Embodiment 1 will be described next with reference to the cross-sectional views in FIGS. 2A to 2D illustrating the manufacturing steps of the electronic components, and the flow chart in FIG. 3 illustrating the manufacturing method.

S1001

First, as illustrated in FIG. 2A, the electronic element 20 and the external connection terminal 30 are disposed (formed) on the first principal surface of the substrate 10 (e.g. silicon, glass). The electronic element 20 is not only a semiconductor element, such as a transistor, but may be a display element (e.g. liquid crystal element, organic EL element) or a piezoelectric element. The external connection terminal 30 is made of metal material (e.g. aluminum, copper), and a pattern is formed using a known semiconductor technique, such as photo-etching and dual damascene. By this step, the electronic substrate 100 is formed. It is not always necessary to form the electronic substrate 100 in S1001, and an electronic substrate 100, which is generated in advance, may be prepared (provided), for example.

S1002

Then, as illustrated in FIG. 2B, the external connection terminal 30 of the electronic substrate 100 is bonded (connected) to the connection terminal of the circuit member 300 via the connecting member 200. In Embodiment 1, the flexible printed circuit is used for the circuit member 300, and the anisotropic conductive film is used for the connecting member 200, and the external connection terminal 30 is bonded to the circuit member 300 by thermo-compression bonding. In order to increase adhesive strength (reliability of the bonding), the electronic substrate 100 and the circuit member 300 may be joined together using a reinforcing adhesive (reinforcing resin; resin member), which is different from the adhesive member 400, so as to stretch from the front surface and the rear surface of the circuit member 300 to the electronic substrate 100. For the reinforcing adhesive, any adhesive material and curing method may be used.

S1003

Then, as illustrated in FIG. 2C, the adhesive member 400 is formed by coating, between the bonding surface (first principal surface) of the circuit member 300 with the connecting member 200 and the opposite surface thereof (second principal surface). For the adhesive member 400, any adhesive material can be used, and in Embodiment 1, a thermosetting epoxy resin is used.

S1004

Then, as illustrated in FIG. 2D, the package member 500 is mounted so as to cover (contact) the circuit member 300, on which the adhesive member 400 is formed, and the electronic substrate 100. Then the adhesive member 400 is cured, and the second principal surface of the circuit member 300 and the package member 500 are joined together.

Here, the circuit member 300 is joined so as to extend from the position between the package member 500 and the electronic substrate 100 outward beyond the edge of the electronic substrate 100. In Embodiment 1, the adhesive member 400 is cured by heating at 120° C. for 60 minutes using an oven. In S1004, the electronic substrate 100, the connecting member 200, the circuit member 300, the adhesive member 400 and the package member 500 are stacked without any gaps in the stacking direction in the portion where the connecting member 200 is disposed. In other words, the connecting member 200, the circuit member 300 and the adhesive member 400 are joined together so as to be located between the package member 500 and the electronic substrate 100. Thereby the electronic component according to Embodiment 1 is completed.

Effect

As described above, in the electronic component according to Embodiment 1, the circuit member 300 and the package member 500 are joined together by the adhesive member 400, hence the adhesive strength to the force applied to the circuit member 300 in the horizontal direction (direction parallel with the first principal surface of the electrode substrate) improves. Further, the electronic substrate 100, the connecting member 200, the circuit member 300, the adhesive member 400 and the package member 500 are stacked without any gaps in the stacking direction. This means that the electronic component has a structure where the bonding portion between the electronic substrate 100 and the circuit member 300 is pressed down by the adhesive member 400 and the package member 500. Therefore, the adhesive strength (bonding strength), in the case where force is applied to the circuit member 300 in the stacking direction, improves.

By this configuration of the electronic component, reliability of the bonding between the circuit member 300 and the electronic substrate 100 improves, which makes it possible to further decrease the width of the external connection terminal 30. As a consequence, downsizing of the electronic substrate 100 can be implemented while maintaining reliability of the bonding between the circuit member 300 and the electronic substrate 100.

Embodiment 2

Figure 4A:
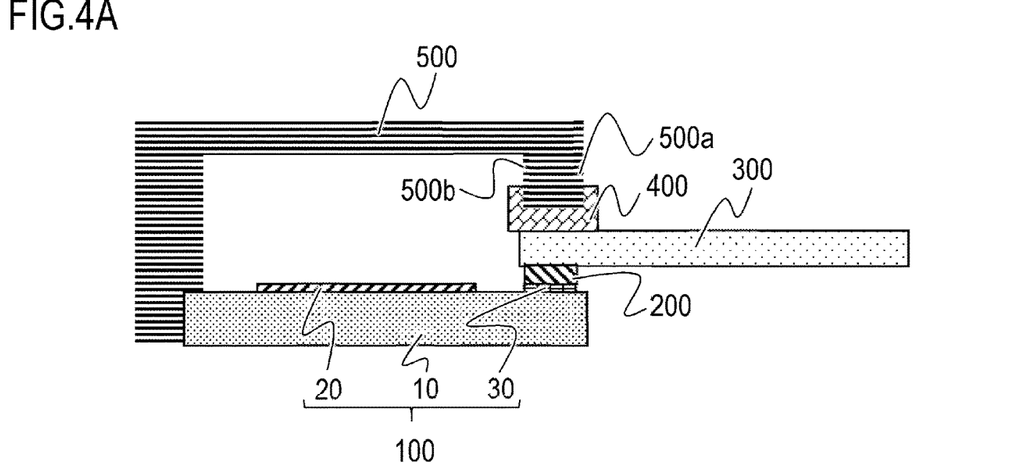
FIG. 4A is a diagram illustrating an electronic component according to Embodiment 2.

An electronic component according to Embodiment 2 will be described with reference to FIG. 4A. FIG. 4A is a schematic cross-sectional view explain the electronic component according to Embodiment 2.

Unlike Embodiment 1, in the electronic component according to Embodiment 2, the adhesive member 400 disposed on the circuit member 300 extends so as to cover the side face 500a on the outer side and the side face 500b on the inner side of the package member 500. In other words, a part of the package member 500 is embedded in the adhesive member 400. Since the adhesive member 400 is disposed on the side face 500b on the inner side of the package member 500 as well, the adhesive strength to the force of pulling the circuit member 300 in the horizontal direction can be improved.

The electronic component of Embodiment 2 can be manufactured by the same manufacturing method as Embodiment 1, but the coating amount of the adhesive member 400 must be slightly more since the adhesive member 400 extends to the side faces of the package member 500 in S1003. Further, when the package member 500 is mounted on the electronic substrate 100 in S1004, it is preferable that the force pressing down is stronger than the case of Embodiment 1.

According to the electronic component of Embodiment 2, the adhesive strength (bonding strength) to the force applied to the circuit member 300 in the horizontal direction can be improved even more than Embodiment 1. Since the width of the external connection terminal 30 can be decreased even more, a further downsizing of the electronic substrate 100 can be implemented.

Embodiment 3

Figure 4B:
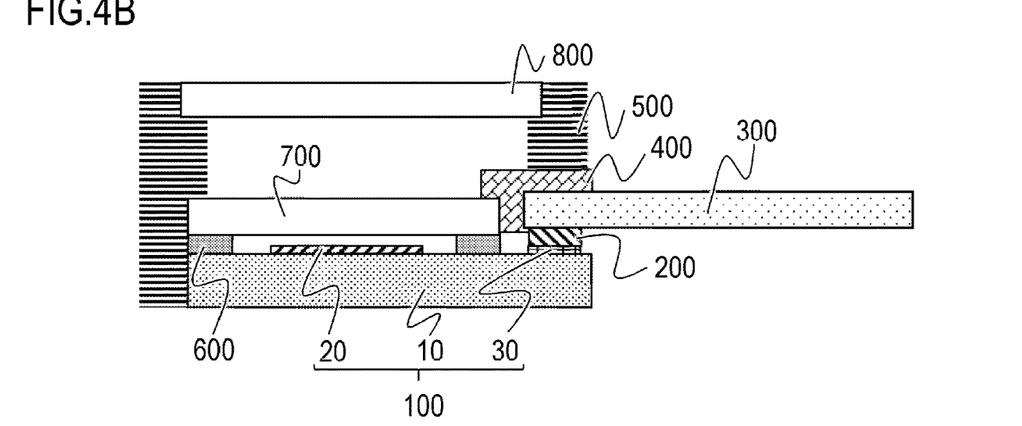
FIG. 4B is a diagram illustrating an electronic component according to Embodiment 3.

An electronic component according to Embodiment 3 will be described with reference to FIG. 4B. FIG. 4B is a schematic cross-sectional view to explain the electronic component according to Embodiment 3.

Unlike Embodiment 1, in the electronic component according to Embodiment 3, a light-transmitting type opposing substrate 700 is disposed so as to oppose the first principal surface of the electronic substrate 100 via a space, as illustrated in FIG. 4B, and the adhesive member 400 extends to the opposing substrate 700. Further, a light-transmitting member 800 is disposed so as to oppose the first principal surface of the electronic substrate 100 and be enclosed by the package member 500. The package member 500 may be regarded as a package member in the narrow sense. And a member combining the opposite substrate 700 and the package member 500, or a member combining the light-transmitting member 800 and the package member 500, may be regarded as a package member in the broad sense. In other words, a member enclosing the space that exists on the first principal surface of the electronic substrate 100 may be regarded as the package member.

In Embodiment 3, the electronic element 20 is a display element such as a liquid crystal element, and an organic EL element, or an image pickup element such as a photoelectric conversion element. The photoelectric conversion element may have, for example, a photodiode structure, a photo-gate structure, or a structure including a photoelectric convertor and an electrode pair sandwiching the photoelectric convertor. The electronic element 20 includes a transistor to drive the display element or the photoelectric conversion element. The external connection terminal 30 is formed by the same method as Embodiment 1.

The opposing substrate 700 is joined (bonded) to the electronic substrate 100 via the bonding member 600, which is an adhesive to join (bond) the two substrates together. The material of the opposing substrate 700 is not especially limited as long as it is a light-transmitting material, and may be glass and acrylic plating. It is preferable that the opposing substrate 700 made of a material having rigidity (rigid member). In Embodiment 3, the bonding member 600 is formed only in the region where the electronic element 20 is not formed, but the bonding member 600 may be formed so as to cover the region where the electronic element 20 is formed. For the bonding member 600, any adhesive may be used, but a UV curable resin is preferable.

The opposing substrate 700 is also joined to the circuit member 300 via the adhesive member 400. This means that the adhesive member 400 is formed so as to contact both the package member 500 and the opposing substrate 700. The adhesive member 400 covers the side face (inner side surface) of the package member 500 facing the space between the electronic substrate 100 and the opposing substrate 700. The adhesive member 400 is coated on the circuit member 300, and the adhesive member 400 can be formed so as to extend to the opposing substrate 700 utilizing the protrusion of the adhesive member 400 in the horizontal direction caused by pressing the package member 500 down.

The light-transmitting member 800 is disposed so as to oppose the first principal surface of the electronic substrate 100, and is disposed in the opening of the package member 500. The light-transmitting member 800 may be installed after mounting the package member 500 on the electronic substrate 100, or the package member 500 may be mounted on the electronic substrate 100 after the light-transmitting member 800 is installed in the package member 500. The material of the light-transmitting member 800 is not especially limited as long as it is a light-transmitting material, and may be glass and acrylic plating.

In the electronic component of Embodiment 3, the adhesive member 400 is joined not only to the package member 500, but also to the opposing substrate 700. Therefore, the adhesive strength (bonding strength) to the force of pulling the circuit member 300 in the horizontal direction, and the adhesive strength to the force of pulling the circuit member 300 in the stacking direction, can be further improved. As a result, the width of the external connection terminal 30 can be further decreased, and a further downsizing of the electronic substrate 100 can be implemented.

Modification 1

Figure 4C:
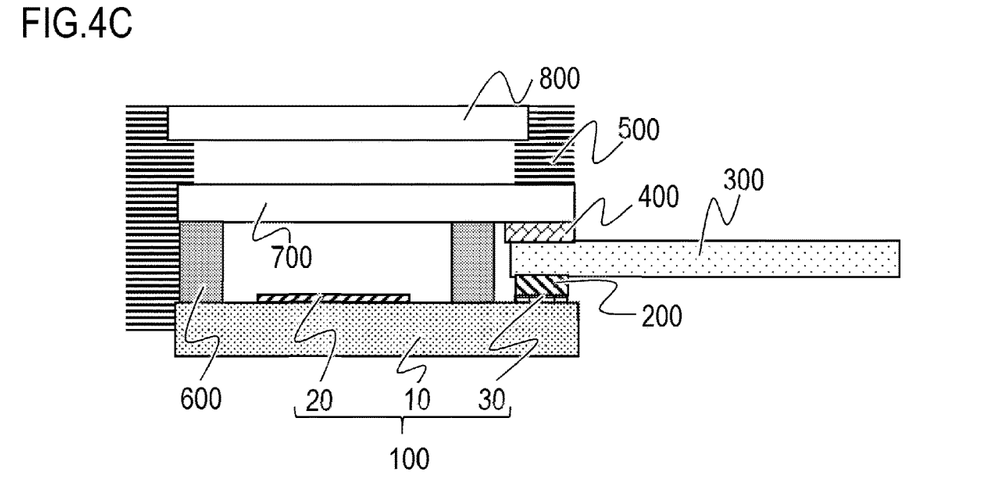
FIG. 4C a diagram illustrating an electronic component according to Modification 1.

An electronic component according to Modification 1 of Embodiment 3 will be described with reference to FIG. 4C. As illustrated in FIG. 4C, in the electronic component, the circuit member 300 is disposed between the electronic substrate 100 and the opposing substrate 700, and the circuit member 300 and the opposing substrate 700 are joined together by the adhesive member 400. Specifically, the portion of the second principal surface of the circuit member 300, which is on the opposite side of the portion of the first principal surface where the connecting member 200 is disposed, is joined to the opposing substrate 700. In other words, in Modification 1, the electronic substrate 100, the connecting member 200, the circuit member 300, the adhesive member 400 and the opposing substrate 700 are sequentially stacked in the stacking direction without any gaps, in the portion where the connecting member 200 is disposed. The connecting member 200, the circuit member 300 and the adhesive member 400 are disposed between the opposing substrate 700 and the electronic substrate 100. The circuit member 300 extends from the position between the opposing substrate 700 and the electronic substrate 100 outward beyond the edge of the electronic substrate 100.

In Modification 1, the electronic component has a structure where the opposing substrate 700 made of rigid material and the circuit member 300 are joined together by the adhesive member 400, so that the opposing substrate 700 is further stacked in the bonding portion between the electronic substrate 100 and the circuit member 300. The opposing substrate 700 is joined to the electronic substrate 100 by the bonding member 600, hence the circuit member 300 does not easily move in the stacking direction. Since the opposing substrate 700 plays the same function as the package member 500 in other embodiments, the structure of the electronic component of Modification 1 is regarded as having the same structure as other embodiments, and can implement the same effect as the other embodiments.

By Modification 1 as well, the adhesive strength (bonding strength) to the force of pulling the circuit member 300 in the horizontal direction and the stacking direction can be improved. As a result, the width of the external connection terminal 30 can be further decreased, and a further downsizing of the electronic substrate 100 can be improved.

Embodiment 4

Figure 5A:
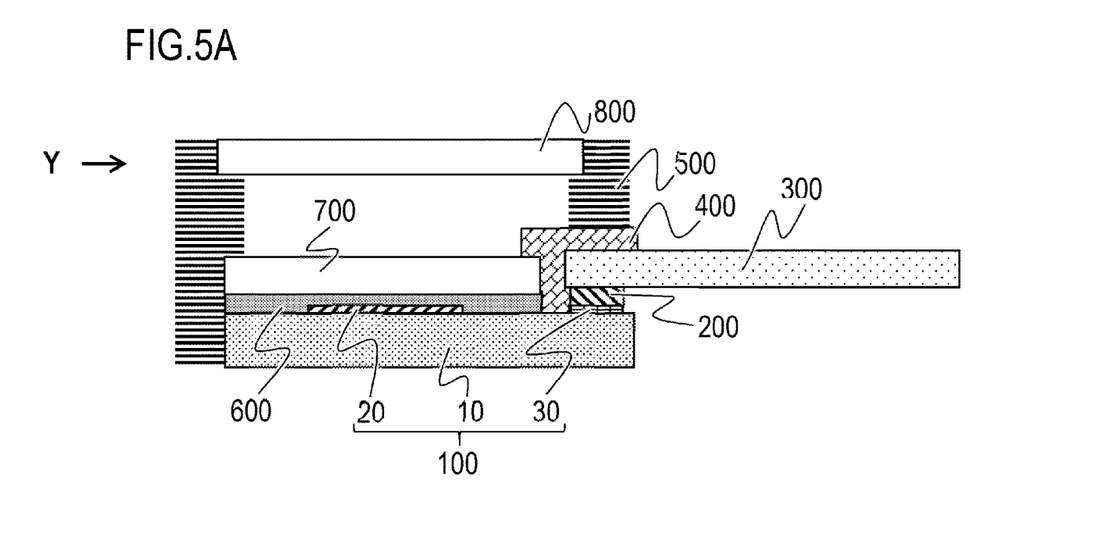
FIGS. 5A and 5B are diagrams illustrating an electronic component according to Embodiment 4.
Figure 5B:
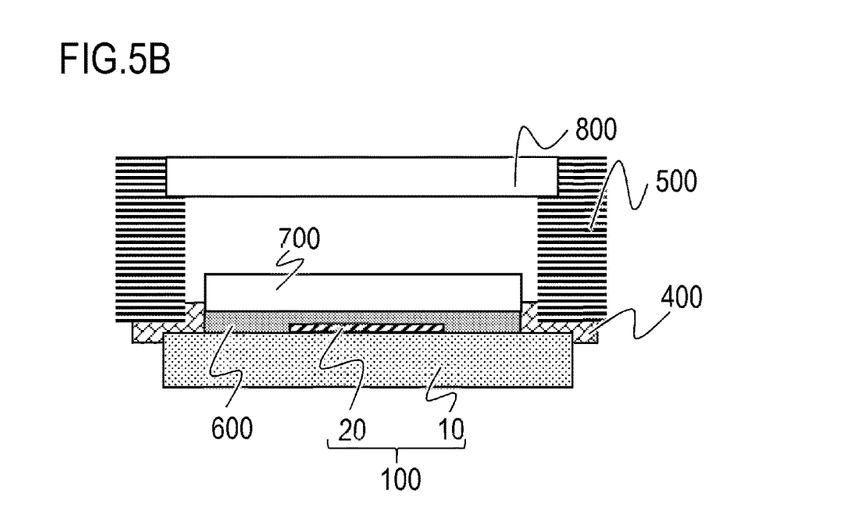

An electronic component according to Embodiment 4 of the present technique will be described with reference to FIGS. 5A and 5B. FIG. 5A is a schematic cross-sectional view to explain the electronic component according to Embodiment 4. FIG. 5B is a schematic cross-sectional view when the electronic component is viewed in the arrow Y direction (side face direction) in FIG. 5A. In Embodiment 4, the electronic element 20 is an organic EL element.

Unlike Embodiment 3, the bonding member 600 is formed so as to fill (bond) the space between the electronic substrate 100 and the opposing substrate 700 throughout the region where the electronic element 20 is formed. Further, the adhesive member 400 contacts the side face of the bonding member 600.

Furthermore, as illustrated in FIG. 5B, the adhesive member 400 contacts not only the side of the bonding member 600 on the circuit member 300 side, but encloses the bonding member 600 so that the bonding member 600 is not exposed to air. In the case of the electronic apparatus illustrated in FIG. 5B, the bonding member 600 is not enclosed by the adhesive member 400 on the side where the package member 500 and the opposing substrate 700 are in contact with each other. In other words, the bonding member 600 is enclosed by the adhesive member 400 in the portion where the bonding member 600 is exposed. However, the present invention is not limited to this, and the bonding member 600 may be completely enclosed by the adhesive member 400.

If there is a space between the electronic substrate 100 and the opposing substrate 700, a part of the light-emitting components from the electronic element 20 (organic EL element) is reflected or refracted at the interface between the electronic substrate and air, which drops the light extraction efficiency. By disposing the bonding member 600 throughout the region where the electronic element 20 is formed, as in Embodiment 4, the light extraction efficiency can be improved.

High light-transmitting performance is demanded for the bonding member 600, but at the same time, it is preferable that the bonding member 600 has moisture resistance in order to protect the electronic element 20. However, the electronic element 20, which is an organic EL element, is easily affected by moisture and heat, and the bonding member 600 must be formed by low temperature curing (100° C. or less). Because of this processing restriction, it is difficult for the bonding member 600 to be highly moisture resistance.

Therefore the infiltration of moisture to the bonding member 600 is prevented by disposing the adhesive member 400, which has highly moisture resistance, so as to contact the side face of the bonding member 600. For the adhesive member 400, which is not required to have high light transmittance, any material having highly moisture resistance can be used.

In Embodiment 4, the adhesive member 400 is coated on the circuit member 300, and the adhesive member 400 is also coated on the electronic substrate 100 near the portion where the bonding member 600 is exposed. After the package member 500 is mounted on the adhesive member 400, the adhesive member 400 is cured, whereby manufacture of the electronic component completes.

For the adhesive member 400, any one of two-liquid curing resin, UV curing resin and thermosetting resin may be used. However, in the case of the light-shielding type package member 500, which makes it difficult to sufficiently UV-cure the adhesive member 400, the adhesive member 400 must be cured at low temperature, considering the heat resistance of the organic EL element. Therefore, it is preferable to use the two-liquid curing resin for the adhesive member 400. In Embodiment 4, two-liquid curing epoxy resin is used.

According to Embodiment 4, the adhesive member 400, which has higher moisture resistance than the bonding member 600, is formed so as to enclose the bonding member 600, whereby the bonding member 600 can be selected considering only the light transmittance and process restrictions. Hence a bonding member 600 which has higher light transmittance or which can be more easily formed can be selected. Further, moisture infiltration into the electronic element 20 can be prevented by the adhesive member 400, therefore an electronic component having an even higher reliability can be implemented.

The present technique can be applied to an apparatus that includes any one of the electronic components of the above mentioned embodiments. The apparatuses to which the present technique can be applied are, for example, a smartphone, a camera, a personal computer and other electronic information apparatuses (electronic apparatuses, information apparatuses). The present technique can also be applied to, for example, a communication apparatus to perform wireless communication, an office apparatus such as a copier and scanner, and a transport apparatus used for automobiles, ships and airplanes. The present technique can also be applied to, for example, an industrial apparatus (e.g. robot), an analytical apparatus using energy rays (lights, electrons, radio waves), and a medical apparatus (e.g. endoscope, radiology equipment). In an apparatus to which the present technique is applied, the circuit member of the electronic component of the above mentioned embodiments is connected to another component included in the apparatus. The functions of other components to which the circuit member of the electronic component is connected can be set according to the functions of the electronic component, which are, for example, a function to control or drive the electronic component, or a function to process a signal for communicating with the electronic component. Using the electronic component of Embodiment 4 in apparatuses is advantageous to improve durability of the reliability of the apparatuses, as well as in downsizing the apparatuses.

Figure 7:
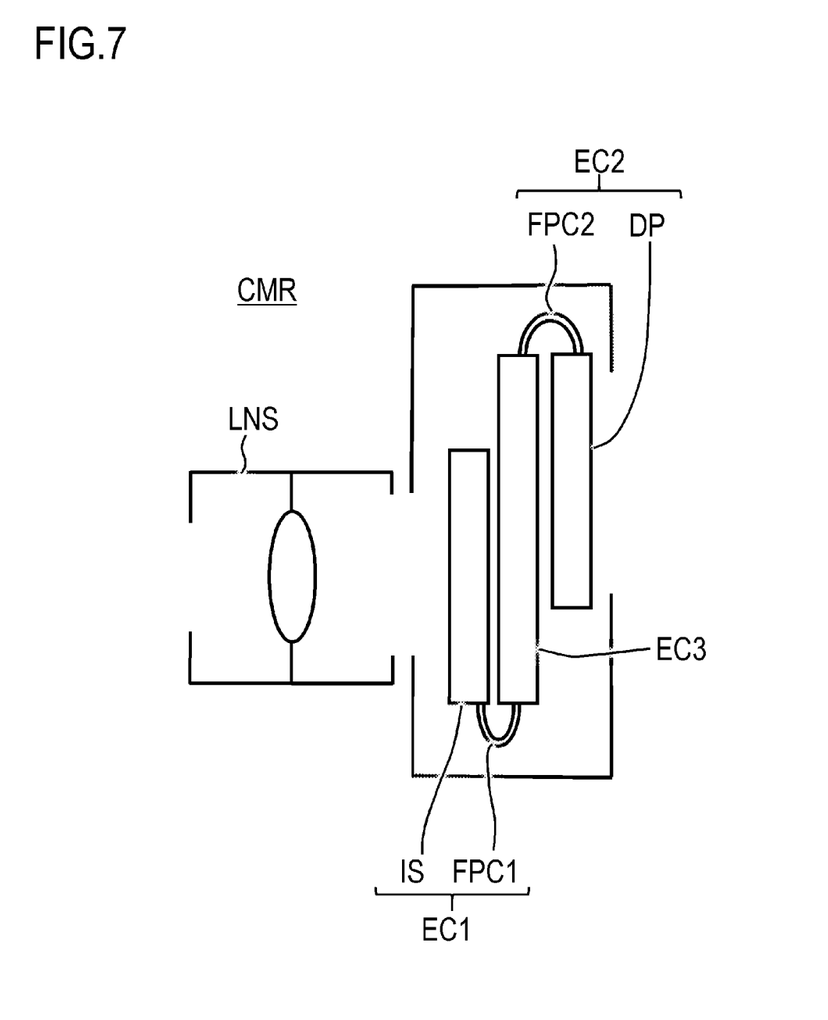
FIG. 7 is a diagram illustrating an apparatus (camera).

FIG. 7 is a diagram illustrating a camera CMR, which is an example of an apparatus to which the present technique is applied. The camera CMR may have an electronic component EC1 which includes an image sensor IS and a flexible printed circuit FPC1. The camera CMR may have an electronic component EC2 which includes a display DP and a flexible printed circuit FPC2. The camera CMR may have another component EC3 to which the flexible printed circuit FPC1 and/or the flexible printed circuit FPC2 are/is connected. The camera CMR may have a lens LNS which is detachable from the camera body, or a lens LNS which is fixed to the camera body. Any one of the electronic components of the above mentioned embodiments may be either the electronic component EC1 or the electronic component EC2. The image sensor IS includes the electronic substrate 100 including the photoelectric conversion element (electronic element 20), and the flexible printed circuit FPC1 corresponds to the circuit member 300. The display DP includes the electronic substrate 100 which has a display element (electronic element 20), and the flexible printed circuit FPC2 corresponds to the circuit member 300. The electronic substrate 100 of the electronic component EC2 may constitute an electronic view finder (EVF).

According to this technique, in the electronic component, the electronic substrate can be downsized while maintaining reliability of the bonding between the electronic substrate and the circuit member.

Each term in this description is merely to describe the present technique, and may include equivalents thereof, therefore the present technique is not limited by a close reading of a term. The above embodiments are merely examples of how to carry out the present technique, and therefore the technical scope of the present technique is not limited by these embodiments. In other words, the disclosure of the present technique can be implemented in various ways without departing from the technical concept or major features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electronic component comprising:
    an electronic substrate that includes an electronic element and a first connection terminal;
    a package member that is disposed on the electronic substrate;
    a circuit member that includes a second connection terminal, wherein the circuit member is disposed between the package member and the electronic substrate, and the circuit member extends from a position between the package member and the electronic substrate outward beyond an edge of the electronic substrate;
    a connecting member that is disposed between the circuit member and the electronic substrate, and electrically connects the second connection terminal and the first connection terminal;
    an adhesive member that is disposed between the circuit member and the package member, and joins the circuit member to the package member; and
    an opposing substrate that faces the electronic substrate, wherein:
    the connecting member, the circuit member and the adhesive member are located between the package member and the electronic substrate;
    the opposing substrate and the electronic substrate are bonded together by a bonding member; and
    the opposing substrate and the circuit member are joined together by the adhesive member.
2. The electronic component according to claim 1, further comprising a light-transmitting member that faces the electronic substrate via a space, wherein the package member encloses the space.
3. The electronic component according to claim 2, wherein the package member has a side face which faces the space, and the adhesive member covers the side face of the package member.
4. The electronic component according to claim 1, wherein the connecting member is an anisotropic conductive film.
5. The electronic component according to claim 1, wherein the circuit member is a flexible printed circuit.
6. The electronic component according to claim 1, wherein the adhesive member is a thermosetting epoxy resin.
7. The electronic component according to claim 1, wherein the adhesive member is a two-component curable epoxy resin.
8. The electronic component according to claim 1, wherein the electronic substrate and the circuit member are joined together by a resin member that is different from the adhesive member.
9. The electronic component according to claim 1, wherein the bonding member is enclosed by the adhesive member.
10. The electronic component according to claim 1, wherein the adhesive member has a higher moisture resistance than has the bonding member.
11. The electronic component according to claim 1, wherein the bonding member is a UV-cured resin.
12. The electronic component according to claim 1, wherein the electronic element is an organic EL element.
13. The electronic component according to claim 1, wherein the electronic element is a photoelectric conversion element.
14. An apparatus comprising:
    the electronic component according to claim 1; and
    a component connected to the circuit member.
15. A camera comprising:
    the electronic component according to claim 1; and
    a component connected to the circuit member,
    wherein the electronic substrate constitutes an electronic view finder.

* * * * *